United States Patent
Imamiya

(10) Patent No.: US 7,135,911 B2
(45) Date of Patent: Nov. 14, 2006

(54) POTENTIAL DETECTOR AND SEMICONDUCTOR INTEGRATED CIRCUIT

(75) Inventor: Kenichi Imamiya, Ota-Ku (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 11/223,959

(22) Filed: Sep. 13, 2005

(65) Prior Publication Data

US 2006/0006926 A1    Jan. 12, 2006

Related U.S. Application Data

(60) Division of application No. 10/664,917, filed on Sep. 22, 2003, now Pat. No. 6,954,101, which is a continuation of application No. 10/270,443, filed on Oct. 15, 2002, now Pat. No. 6,642,775, which is a division of application No. 09/863,408, filed on May 24, 2001, now Pat. No. 6,486,729.

(30) Foreign Application Priority Data

May 24, 2000  (JP)  ............... 2000-153660
May 18, 2001  (JP)  ............... 2001-149496

(51) Int. Cl.
  *G05F 1/10* (2006.01)
(52) U.S. Cl. .................................... 327/536
(58) Field of Classification Search ............ 327/530, 327/534, 535, 536, 537, 539
  See application file for complete search history.

(56) References Cited

U.S. PATENT DOCUMENTS

| | | | |
|---|---|---|---|
| 3,824,447 A | 7/1974 | Kuwabara | |
| 4,935,644 A | 6/1990 | Tsujimoto | |
| 4,970,409 A | 11/1990 | Wada et al. | |
| 5,043,858 A | 8/1991 | Watanabe | |
| 5,059,815 A | * 10/1991 | Bill et al. | 327/536 |
| 5,365,121 A | 11/1994 | Morton et al. | |
| 5,381,051 A | 1/1995 | Morton | |
| 5,397,931 A | 3/1995 | Bayer | |
| 5,406,523 A | 4/1995 | Foss et al. | |
| 5,532,640 A | 7/1996 | Okunaga | |
| 5,801,577 A | 9/1998 | Tailliet | |
| 5,812,001 A | 9/1998 | Imamiya | |
| 5,818,766 A | 10/1998 | Song | |

(Continued)

FOREIGN PATENT DOCUMENTS

JP   06-351229 A   12/1994

*Primary Examiner*—Jeffrey Zweizig
(74) *Attorney, Agent, or Firm*—Banner & Witcoff, Ltd.

(57) ABSTRACT

An integrated semiconductor circuit has a potential detector for detecting a potential boosted by a high voltage generator. One terminal of a first capacitor is connected to a potential detection terminal via a first switching device, the other terminal thereof being connected to a reference potential terminal. A terminal of a second capacitor is connected, via a second switching device, to a first node at which the first switching device and the first capacitor are connected, the other terminal thereof being connected to the reference potential terminal. A third switch is connected between a second node at which the second switching device and the second capacitor are connected and the reference potential terminal. A clock generator generates clock signals to simultaneously and periodically turn on the first and the third switching devices whereas turn on the second switch periodically in an opposite timing for the first and the third switching devices. A comparator compares a potential at the second node with a reference potential and outputs a detection signal when a potential at the potential detection terminal reaches a predetermined potential.

12 Claims, 13 Drawing Sheets

U.S. PATENT DOCUMENTS

| | | |
|---|---|---|
| 5,856,918 A | 1/1999 | Soneda et al. |
| 5,914,632 A | 6/1999 | Fotouhi et al. |
| 5,955,895 A | 9/1999 | Tomasini et al. |
| 6,046,626 A | 4/2000 | Saeki et al. |
| 6,130,574 A | 10/2000 | Bloch et al. |
| 6,278,318 B1 | 8/2001 | Watanabe |
| 6,356,137 B1 | 3/2002 | Roohparvar et al. |
| 6,356,469 B1 | 3/2002 | Roohparvar et al. |
| 6,373,324 B1 | 4/2002 | Li et al. |
| 6,407,628 B1 | 6/2002 | Imamiya |
| 2001/0033195 A1 | 10/2001 | Kanada et al. |

* cited by examiner

POTENTIAL DETECTOR AND SEMICONDUCTOR INTEGRATED CIRCUIT

CROSS REFERENCE TO RELATED APPLICATIONS

This application is a divisional of prior U.S. patent application Ser. No. 10/664,917, filed Sep. 22, 2003, now U.S. Pat. No. 6,954,101, which is a continuation of prior U.S. patent application Ser. No. 10/270,443, filed Oct. 15, 2002, now U.S. Pat. No. 6,642,775, which is a divisional of prior U.S. patent application Ser. No. 09/863,408, filed May 24, 2001, now U.S. Pat. No. 6,486,729, which claims benefit of priority under 35 U.S.C. § 119 to Japanese Patent Application No. 2000-153660, filed on May 24, 2000 and Japanese Patent Application No. 2001-149496, filed on May 18, 2001, the entire contents of which are incorporated by reference herein.

BACKGROUND OF THE INVENTION

The present invention relates to a potential detector to detect an electric potential output from a high voltage generator, etc., that has reached a certain level in a semiconductor integrated circuit.

FIG. 1 shows a known potential detector 90. The detector 90 consists of resistors R1 and R2 connected in series between a terminal 91 to be detected and a ground terminal $V_{SS}$, and a comparator CMP to compare a potential at a node at which the resistors R1 and R2 are connected together with a reference potential Vref.

The potential at the node of the resistors R1 and R2 is obtained as $V1 \cdot R2/(R1+R2)$ where V1 is a potential at the terminal 91. The comparator CMP outputs a high-level detection signal when the potential at the node exceeds the reference potential Vref.

The potential detector 90 is used, for example, for detecting an output potential Vout of a high voltage generator used in a semiconductor circuit such as a non-volatile semiconductor memory.

FIG. 2 shows an example where the potential detector 90 is used for detecting a potential Vout appearing at an output terminal 91 of a high voltage generator 901 such as a charge pump. The high voltage generator 901 is driven by clocks generated by an oscillator 902 such as a ring oscillator.

The potential detector 90 outputs a detection signal Dout when the potential Vout appearing at the output terminal 91 of the high voltage generator 901 reaches a certain potential to deactivate a gate 903 that has fed clocks generated by the oscillator 902 to the high voltage generator 901. The high voltage generator 901 then stops, so that the boosted output Vout is kept at a constant level, as illustrated in FIG. 3A.

The known potential detector generates a potential by the series-connected resistors, which is compared with a reference potential. A current always flows through the resistors R1 and R2 for generating the potential. The high voltage generator 901 thus requires a drive performance high enough for accepting a current consumed by the resistors R1 and R2. The drive performance of the high voltage generator is decided according to the resistance of the resistors R1 and R2 when a load capacitance to be driven by the high voltage generator is relatively small. This requires drive performance for the high voltage generator higher than that for the high voltage generator to drive the load itself, which is not practical in view of power consumption and circuit integration.

A high voltage generator having unnecessarily high drive performance will generate a potential boosted to a high level during a response time of a potential detector. This results in a large variation in boosted output Vout against an anticipated level, as illustrated in FIG. 3B, with difficulty in obtaining a constantly boosted potential.

The larger the resistance of the resistors R1 and R2 for avoiding such potential variation, the larger the parasitic capacitance to the resistors. This results in a large delay of change in output potential of the high voltage generator, and further a large delay time required for the output potential to be transferred to the input terminal of the comparator CMP. Change in output potential of the high voltage generator illustrated in FIG. 3C does not have an abrupt potential increase such as shown in FIG. 3B, however, exhibits a slow response. This also results in unstably un-converted potential output.

SUMMARY OF THE INVENTION

A purpose of the present invention is to provide a potential detector integrated on a small area and capable of stable potential detection while consuming a small power.

Another purpose of the present invention is to provide a semiconductor integrated circuit with the potential detector and having a high voltage generator for generating a constant potential output.

The present invention provides a potential detector comprising: a first capacitor, one terminal thereof being connected to a potential detection terminal via a first switching device, another terminal thereof being connected to a reference potential terminal; a second capacitor, a terminal thereof being connected, via a second switching device, to a first node at which the first switching device and the first capacitor are connected, another terminal thereof being connected to the reference potential terminal; a third switch connected between a second node at which the second switching device and the second capacitor are connected and the reference potential terminal; a clock generator for generating clock signals to simultaneously and periodically turn on the first and the third switching devices whereas turn on the second switch periodically in an opposite timing for the first and the third switching devices; and a comparator for comparing a potential at the second node with a reference potential and outputting a detection signal when a potential at the potential detection terminal reaches a predetermined potential.

Moreover, the present invention provides a semiconductor integrated circuit having a high voltage generator for generating a boosted internal power supply potential and a potential detector for controlling the high voltage generator by detecting a potential at an output terminal of the high voltage generator, the potential detector comprising: a first capacitor, one terminal thereof being connected to an output terminal of the high voltage generator via a first switching device, another terminal thereof being connected to a reference potential terminal; a second capacitor, one terminal thereof being connected, via a second switching device, to a first node at which the first switching device and the first capacitor are connected, another terminal thereof being connected to the reference potential terminal; a third switching device connected between a second node at which the second switching device and the second capacitor are connected and the reference potential terminal; a clock generator for generating clock signals to simultaneously and periodically turn on the first and the third switching devices whereas turn on the second switching device periodically in an opposite timing for the first and the third switching devices; and a comparator for comparing a potential at the second node with a reference potential and outputting a detection signal when a potential at the potential detection terminal reaches a predetermined potential.

Furthermore, the present invention provides a semiconductor integrated circuit having a high voltage generator for generating a boosted internal power supply potential, the high voltage generator comprising: a plurality of charging circuits, each having a capacitor, one terminal thereof being connected to a high-level side power terminal via a first switching device, another terminal thereof being connected to a low-level side power terminal via a second switching device; and a plurality of third switching devices each provided between adjacent two charging circuits so that a node at which the first switching device and the capacitor of each charging circuit are connected is connected to another node at which the second switching device and the capacitor of the succeeding charging circuit are connected, wherein the capacitor of each charging circuit is charged with a potential almost equal to a power supply potential when the first and the second switching devices are turned on whereas the third switching devices are turned off and the charged capacitors of the charging circuits are coupled in series when the first and the second switching devices are turned off whereas the third switching devices are turned on, thus outputting a boosted potential.

Moreover, the present invention provides a semiconductor integrated circuit having a high voltage generator for generating a boosted internal power supply potential, the high voltage generator comprising: a charge pump having a plurality of first capacitors, adjacent two first capacitors being driven by clocks in opposite timing and a transfer device for transferring charges stored in each first capacitor to the succeeding first capacitor; and a potential converter for supplying a boosted clock to each first capacitor, wherein the potential converter includes: a second capacitor, a first terminal thereof being connected to a high-level side power terminal via a first switching device, a second terminal thereof being connected to a low-level side power terminal via a second switching device that is turned on simultaneously with the first switching device; a third switching device that is turned on in opposite timing for the first and the second switching devices to supply a driving potential to the second terminal of the second capacitor; a fourth switching device that is turned on simultaneously with the third switching device to connect the first terminal of the second capacitor to an output terminal; and a fifth switching device that is turned on simultaneously with the first switching device to reset a potential at the output terminal, wherein the second capacitor is charged while the first and the second switching devices are on and the charged second capacitor is coupled to the first capacitor in series while the third and the fourth switching devices are on.

Furthermore, the present invention provides a semiconductor integrated circuit having a high voltage generator for generating a boosted internal power supply potential, the high voltage generator comprising: a plurality of first capacitors that are charged during a first period; a plurality of second capacitors provided alternately with the first capacitors, the second capacitors being charged during a second period that partially overlaps with the first period; a first transfer device for transferring charges stored in each first capacitor to the succeeding second capacitor during a third period that is delayed from the second period by a predetermined time; and a second transfer device for transferring charges stored in each second capacitor to the succeeding first capacitor during a fourth period that is delayed from the first period by the predetermined time.

DETAILED DESCRIPTION OF PREFERRED EMBODIMENTS

Preferred embodiments according to the present invention will be disclosed with reference to the attached drawings.

Figure 1:
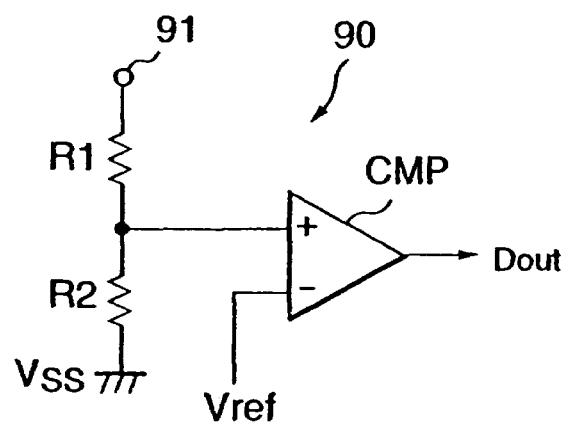
FIG. 1 shows a circuit diagram of a known potential detector.
Figure 2:
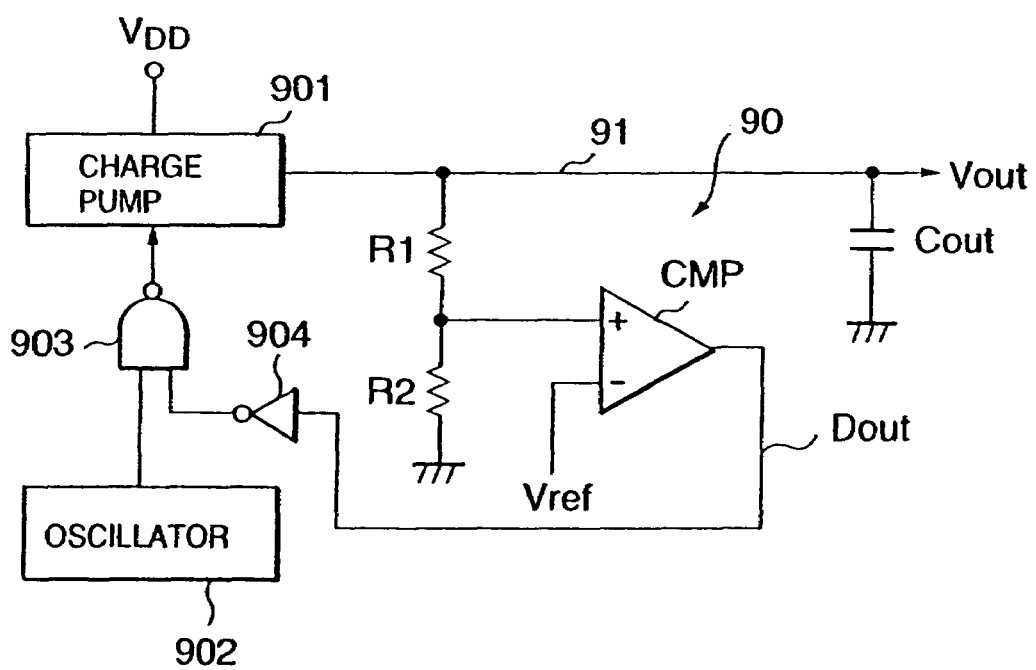
FIG. 2 shows an example circuit diagram to which the known potential detector is applied.
Figure 3A:
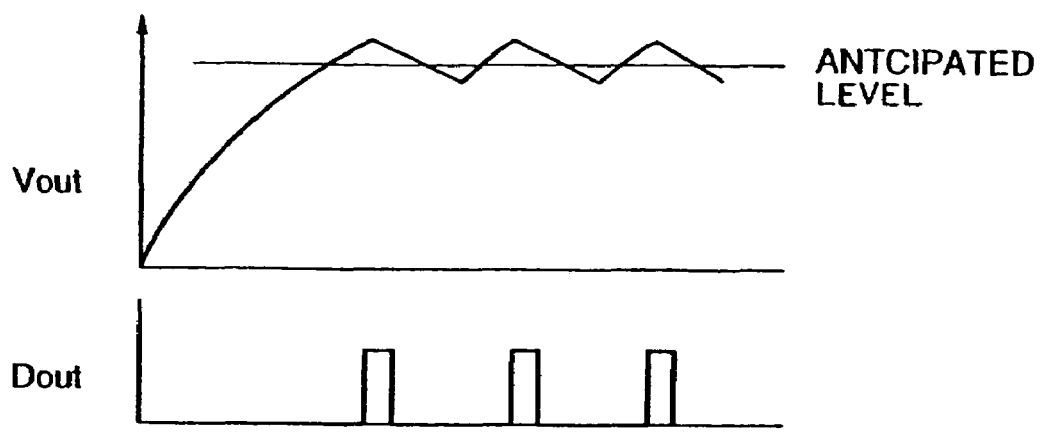
FIGS. 3A to 3C illustrate waveforms in potential up-conversion by the known potential detector.
Figure 3B:
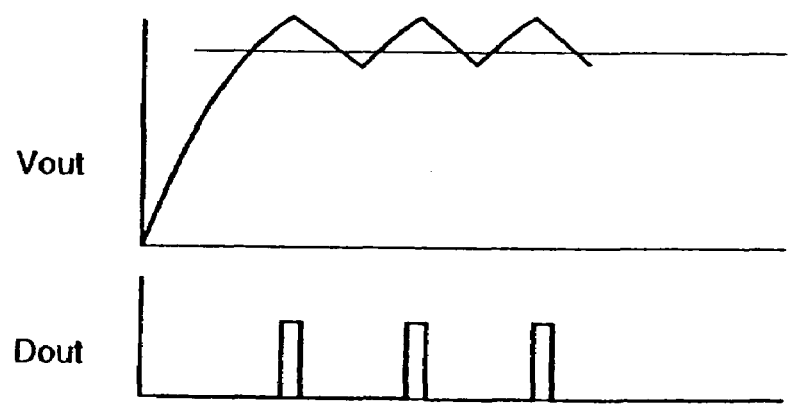
Figure 3C:
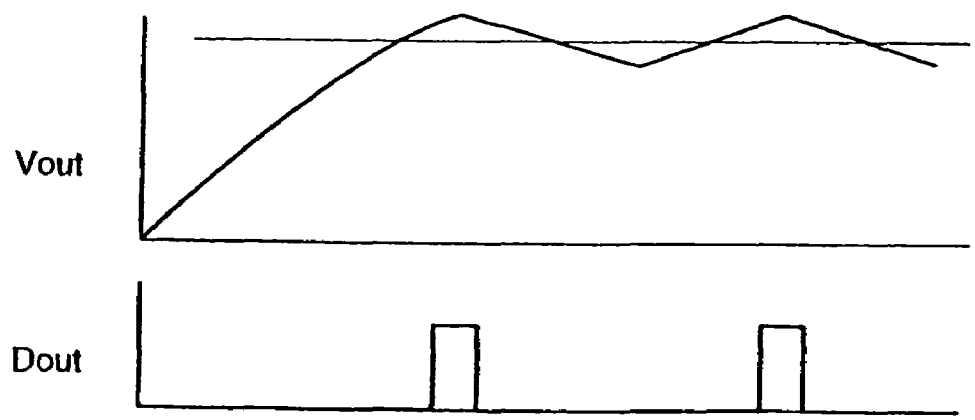
Figure 4:
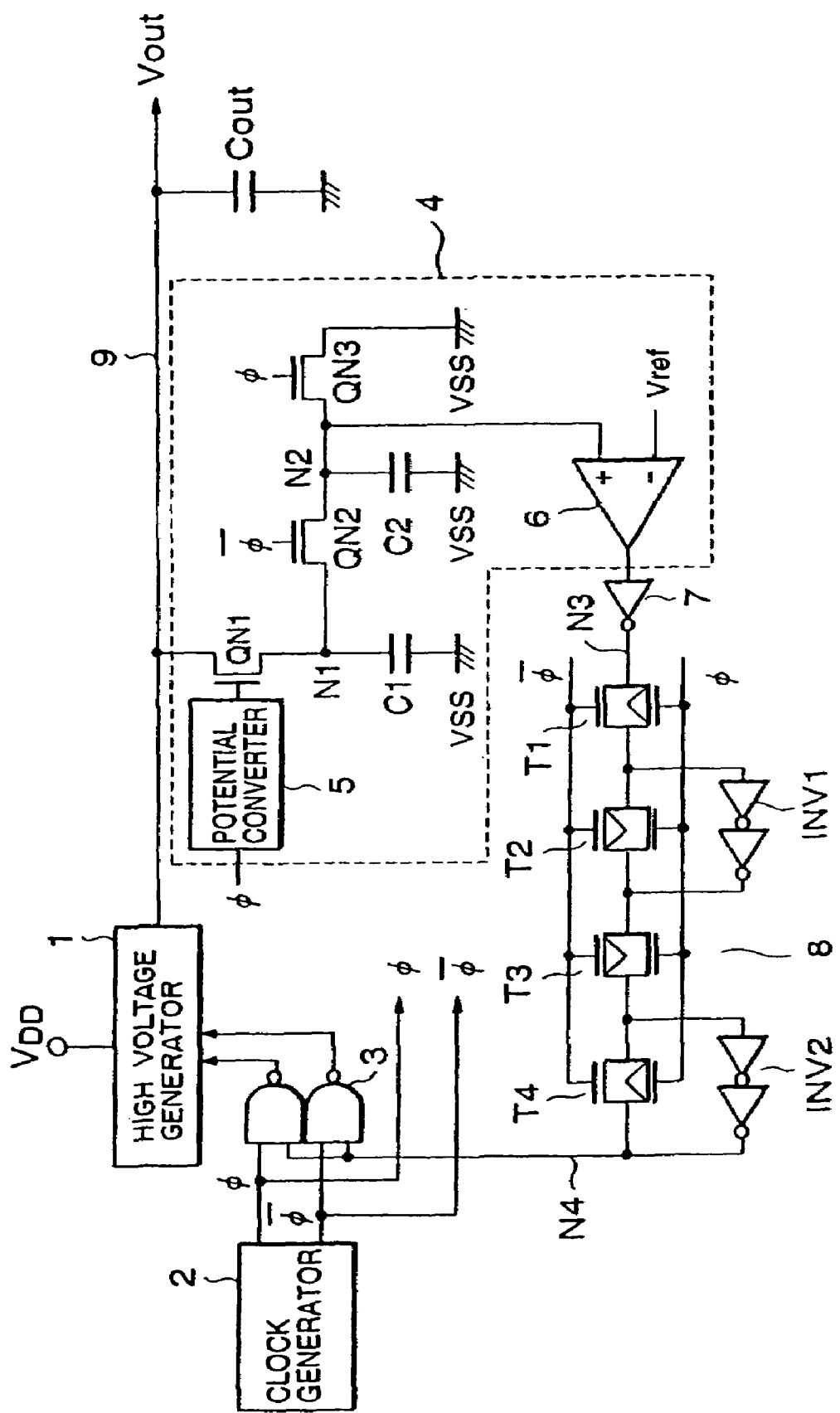
FIG. 4 shows a circuit diagram of a power supply according to the present invention.

FIG. 4 shows a circuit diagram of a power supply used in a semiconductor circuit.

The main components of this circuit are a high voltage generator 1 for obtaining an internal power supply potential higher than a power supply potential $V_{DD}$ and a clock generator 2 for driving the high voltage generator 1.

Figure 5:
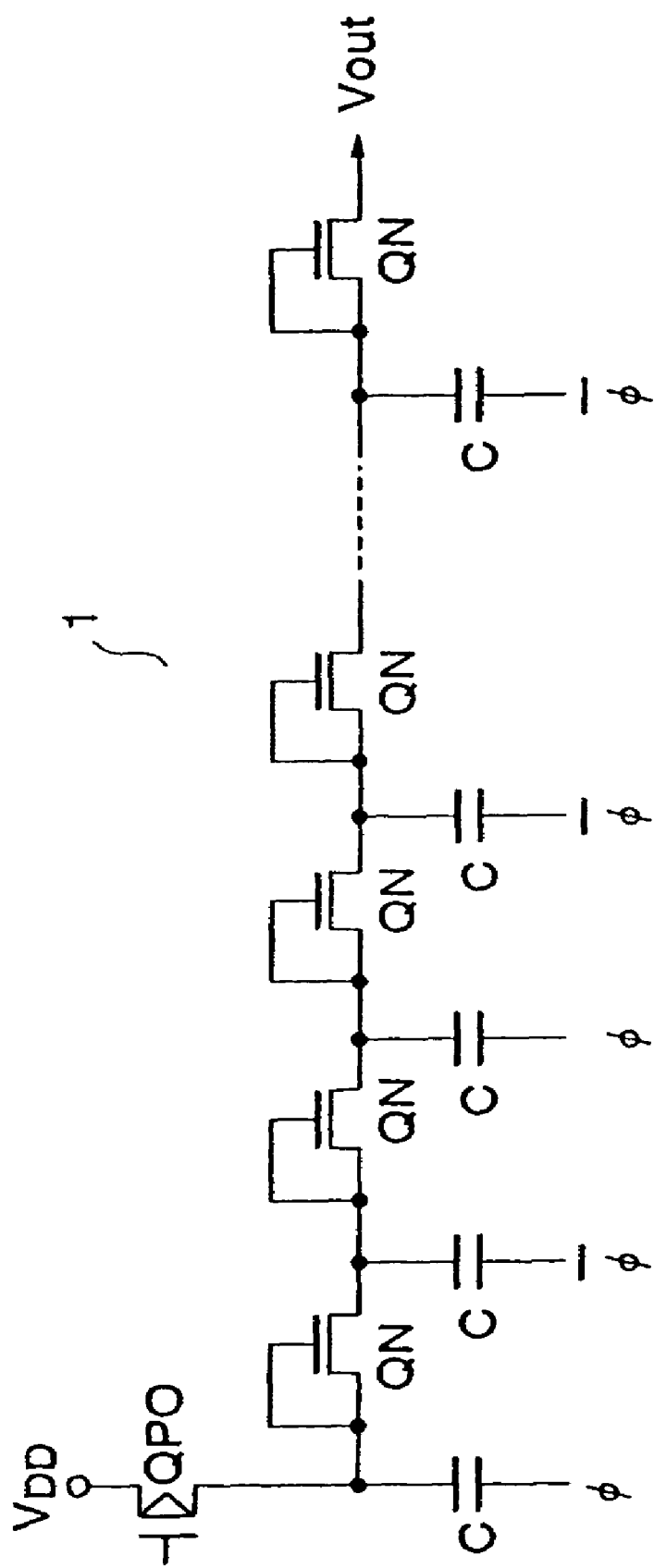
FIG. 5 shows a circuit diagram of a high voltage generator used in the power supply.

The high voltage generator 1 is a known charge pump shown in FIG. 5. The clock generator 2 is, for example, a ring oscillator, that generates clocks $\phi$ and $/\phi$ for controlling the charge pump.

The semiconductor circuit for which the present invention is applied is, for example, a non-volatile semiconductor memory. A boosted output potential Vout of the high voltage generator 1 is used for data programming and erasure.

The complementary clocks $\phi$ and $/\phi$ of the clock generator 2 are selectively supplied to the high voltage generator 1 via a NAND gate 3. The NAND gate 3 is controlled to turn on or off the high voltage generator 1. A potential detector 4 is provided to detect a potential appearing at an output terminal 9 for controlling the high voltage generator 1.

The area surrounded by a dashed line is a main section of the potential detector 4. The detector 4 is also controlled by the complementary clocks $\phi$ and $/\phi$ of the clock generator 2. Another clock generator may be provided only for controlling the potential detector 4.

The potential detector 4 has two capacitors C1 and C2, a terminal of each being connected to a ground terminal $V_{SS}$. The other terminal N1 of the first capacitor C1 is connected to the output terminal 9 of the high voltage generator 1 via an NMOS transistor QN1. The other terminal N2 of the second capacitor C2 is connected to the terminal N1 via an NMOS transistor QN2.

The output (Vout) terminal 9 of the high voltage generator 1 has a large load capacitance Cout in this embodiment. The capacitors C1 and C2 used for the potential detector 4 have capacitance much smaller than the load capacitance Cout.

The NMOS transistor QN1 is a switching device for charging the capacitor C1 with the output Vout of the high voltage generator 1. The gate of the NMOS transistor QN1 is driven by the clock signal $\phi$.

The NMOS transistor QN2 is a switching device for supplying a certain amount of charges stored in the capacitor C1 to the capacitor C2 while short-circuiting the nodes N1 and the N2 of the two capacitors. The gate of the NMOS transistor QN2 is driven by the clock signal $/\phi$.

The node N2 of the capacitor C2 and the NMOS transistor QN2 is connected to the ground terminal $V_{SS}$ via an NMOS transistor QN3 (a resetting-switching device). The gate of the NMOS transistor QN3 is driven by the clock signal $\phi$.

A potential converter 5 is connected to the gate of the NMOS transistor QN1 for up-converting the clock signal $\phi$ to drive the transistor QN1 so that output Vout of the high voltage generator 1 boosted based on the power supply potential $V_{DD}$ is sufficiently transferred to the capacitor C1.

A potential higher than the power supply potential $V_{DD}$ is supplied to the gate of the charging NMOS transistor QN1. On the other hand, the power supply potential $V_{DD}$ is supplied to the gates of the charge-supplying NMOS transistor QN2 and the resetting NMOS transistor QN3. The gate oxide film of the NMOS transistor QN1 is thus formed as thicker than those of the NMOS transistors QN2 and QN3.

The node N2 of the capacitor C2 and the NMOS transistor QN2 is connected to an input terminal of a comparator 6 (a differential amplifier). A reference potential Vref is supplied to the other terminal of the comparator 6. When a potential at the node N2 exceeds the reference potential, the comparator outputs a high-level detection signal.

The detection signal is supplied to a flip-flop 8 via an inverter 7. The flip-flop 8 consists of series-connected four CMOS transfer gates T1 to T4 that are alternately turned on and off by the clock signals $\phi$ and $/\phi$ and two inverter chains INV1 and INV2 connected in parallel to the second and the fourth gates T2 and T4, respectively. The output of the flip-flop 8 is used as a control signal for activating the NAND gate 3.

Figure 6:
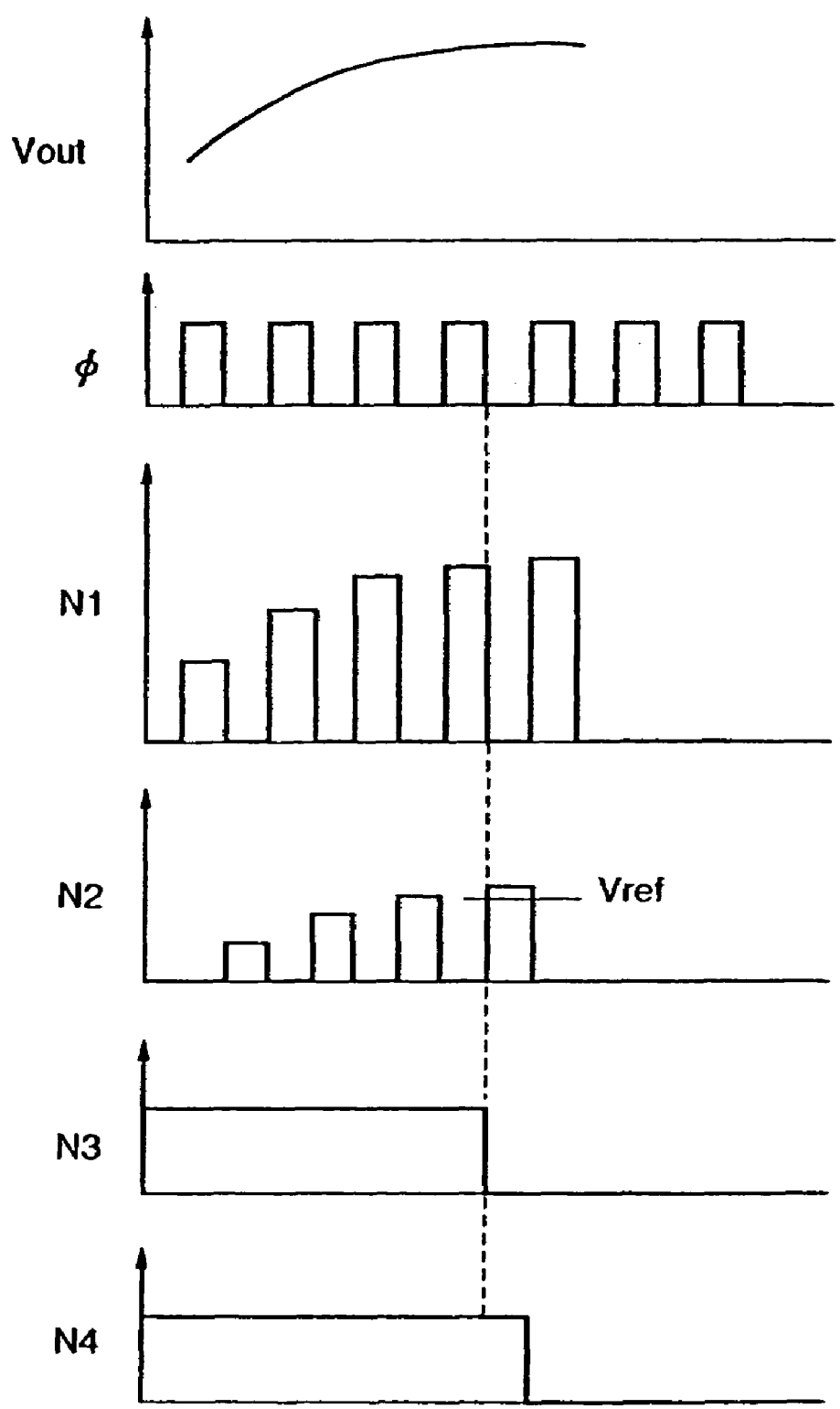
FIG. 6 illustrates waveforms in potential detection by the power supply.

The operation of the high voltage generator 1 of the power supply circuit (FIG. 4) is disclosed with reference to FIG. 6 that illustrates waveforms in up-conversion and potential detection.

The high voltage generator 1 is controlled by the clock signals $\phi$ and $/\phi$ so that the output potential Vout is gradually increased as shown in FIG. 6. In the potential detector 4, the NMOS transistors QN1 and QN3 are turned on whereas the NMOS transistor QN2 is turned off while the clock signal $\phi$ is HIGH. The capacitor C1 is charged with the potential at the output terminal 9 of the high voltage generator 1 while the capacitor C2 is discharged to be reset.

When the clock signal $\phi$ is turned into LOW, the NMOS transistors QN1 and QN3 are turned off whereas the NMOS transistor QN2 is on. The nodes N1 and N2 are thus isolated from the output terminal 9 of the high voltage generator 1 and the ground terminal $V_{SS}$, respectively, and short-circuited with each other. This initiates the supply of the charges that has been stored in the capacitor C1 when sampled at the high-level clock signal $\phi$ to the capacitor C2.

The charge supply results in the same potential at the node N1 and N2. In detail, when the capacitor C1 has been charged with a potential V1, a potential V2 obtained by charge supply is expressed as V2=V1·C1(C1+C2) lower than the potential V1. The potential at the node N2 is thus increased from the ground potential $V_{SS}$ to the potential V2. The potential at the node N2 is compared with the reference potential Vref in the comparator 6.

When the potential at the node N2 has not reached the reference potential Vref, the node N2 is discharged at the next high-level clock signal $\phi$ for another charging of the node N1 with the output of the high voltage generator 1. The charge supply is performed again at the next low-level clock signal $\phi$. These charging and supplying operations are repeated until the potential at the node N2 exceeds the reference potential Vref.

When the potential at the node N2 exceeds the reference potential Vref as the boosted potential Vout has been increased, as shown in FIG. 6, the output of the comparator 6 is inverted and hence a node N3 is turned into LOW. An output node N4 of the flip-flop 8 is then turned into LOW at the high-level clock signal $\phi$. The NAND gate 3 is thus turned off to stop the supply of clock signals to the high voltage generator 1 for halting the up-conversion operation.

The NMOS transistor QN1, a switching device for charging the capacitor C1, is driven by a potential boosted by the voltage converter 5 so that almost no potential drop occurs at the capacitor 1.

The capacitors C1 and C2 have very small capacitance compared to the capacitance Cout of the output terminal 9 of the high voltage generator 1 so that a potential drop that may otherwise occur at the output terminal 9 when the capacitor 1 is coupled to the output terminal 9 via the NMOS transistor QN1 can be disregarded.

A constant output potential Vout under ideal circuit response is expressed as $$\text{Vref} \cdot (C1+C2)/C1 \qquad (1)$$

where C1 and C2 are the capacitance of the capacitors C1 and C2.

A ratio of the capacitance of the capacitors C1 and C2 to the load capacitance Cout of the output terminal 9 of the high voltage generator 1 is preferably 1/10 or lower. This capacitance ratio serves to disregard a potential drop that will occur at the output terminal 9 when the capacitor 1 is coupled to the output terminal 9 via the NMOS transistor QN1.

A constant point of the output potential Vout of the high voltage generator 1 is decided in accordance with the reference potential Vref and the capacitance of the capacitors C1 and C2 according to the expression (1). A ratio of the capacitance of the capacitor C1 to C2 can be set freely.

As described above, according to this embodiment, a boosted potential is detected with capacitor charging and charge supply at low power because of generation of no D.

C. current which is generated in the known method using potential division by resistors.

The smaller the areas, or the capacitance of the capacitors C1 and C2, the larger the equivalent resistance thereof, and hence the smaller the leak current. The high voltage generator 1 is thus free from leakage. Especially, the capacitors C1 and C2 having the capacitance 1/10 or lower of the load capacitance Cout of the output terminal 9 serve to disregard a potential drop occurring at the output terminal 9 when the capacitor C1 is coupled thereto via the NMOS transistor QN1.

Smaller areas for the capacitors C1 and C2 serve to decrease occurrence of leakage different from the known method using resistors, thus high circuit integration is achieved according to this embodiment.

Moreover, a large equivalent resistance to the capacitors C1 and C2 in this embodiment does not increase parasitic capacitance which may otherwise occur in the known method using resistors. The embodiment is thus excellent in circuit response for stable potential detection.

Figure 7:
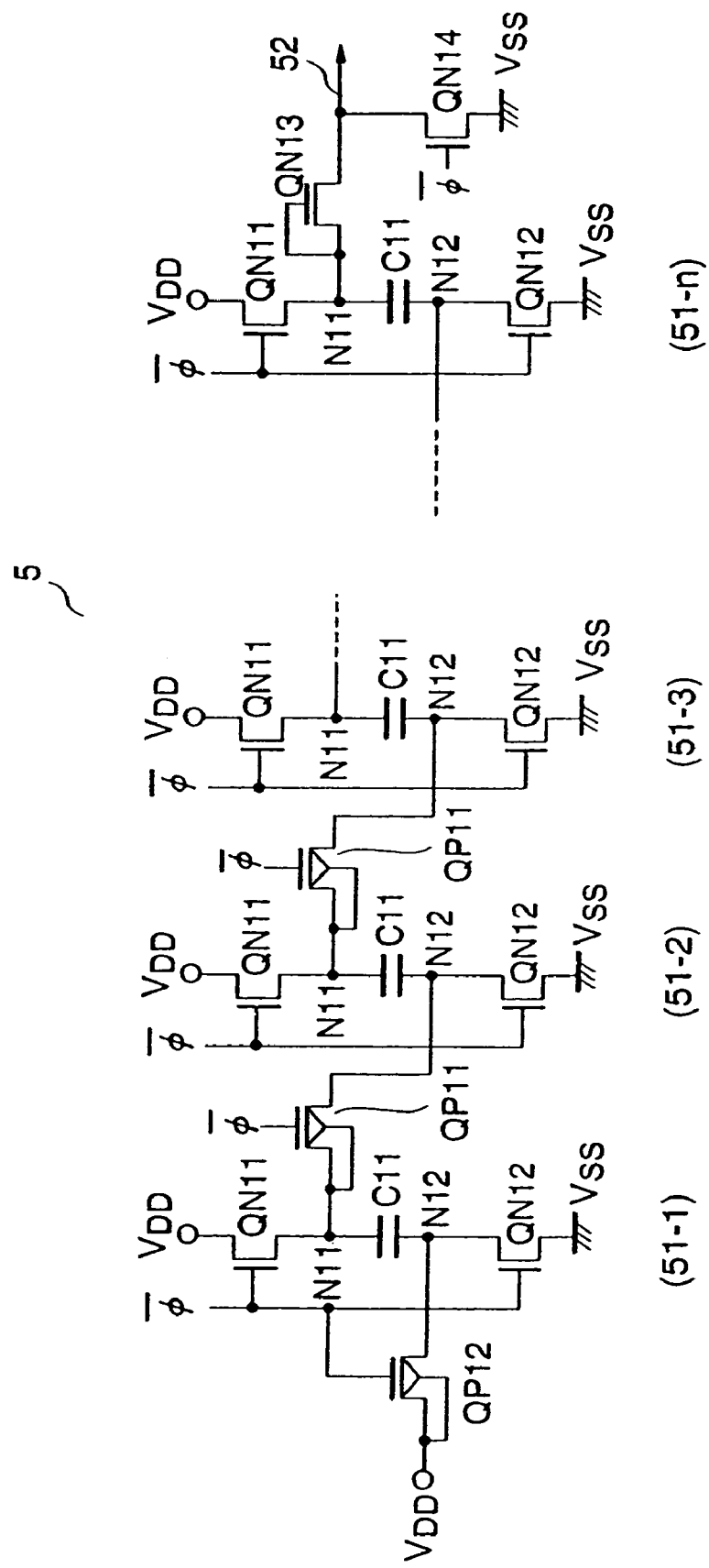
FIG. 7 shows a circuit diagram of a potential converter used in the power supply.

FIG. 7 shows a circuit diagram of the potential converter 5 for driving the charging NMOS transistor QN1 in FIG. 4.

The potential converter 5 shown in FIG. 7 has a plurality of charging circuits 51 (51-1 to 51-n) and switching devices that connect capacitors C11 of the circuits 51 in series.

Each charging circuit 51 has a capacitor C11, a terminal N11 thereof being connected to a high-level side power terminal $V_{DD}$ via a switching device NMOS transistor QN11 and the other terminal N12 being connected to a low-level side power terminal $V_{SS}$ via a switching device NMOS transistor QN12. The gates of NMOS transistors QN11 and QN12 are driven by a clock signal /φ.

PMOS transistors QP11 are switching devices for connecting the capacitors C11 of the charging circuits 51 in series. In detail, each PMOS transistor QP11 is provided to connect a high level-side node N11 of the capacitor C11 of each charging circuit 51 to a low level-side node N12 of the capacitor C11 of the succeeding charging circuit. The gates of the PMOS transistors QP11 are also driven by the clock signal /φ.

The low level-side node N12 of the capacitor C11 of the first charging circuit 51-1 is connected to the high-level side power terminal $V_{DD}$ via a PMOS transistor QP12 driven by the clock signal /φ.

The high level-side node N11 of the capacitor C11 of the last charging circuit 51-n is connected to an output terminal 52 that is connected to the gate of the NMOS transistor QN1 (FIG. 4) via an NMOS transistor QN13 whose gate and source are connected like a diode. Also connected to the output terminal 52 is a resetting NMOS transistor QN14.

An operation of the potential converter 5 shown in FIG. 7 is disclosed.

In each charging circuit 51, the NMOS transistors QN11 and QN12 are turned on at a high-level clock signal /φ to charge the capacitor C11.

When the clock signal /φ is turned into LOW, all charging circuits 51 are turned off whereas the PMOS transistors QP11 between adjacent charging circuits and the PMOS transistor QP12 at the first charging circuit are turned on.

These transistor-switching operations serve to connect the capacitors C11 of all charging circuits 51 in series with a reference potential $V_{DD}$ at the terminal N12 of the capacitor C11 of the first charging circuit 51-1 via the PMOS transistor QP12.

The capacitance-coupling through the series-coupled capacitors C11 of the charging circuits 51 instantaneously produces a high potential at the last charging circuit 51-n. When a charged level for each capacitor C11 is $V_{DD}$, 2 $V_{DD}$, 3 $V_{DD}$, ..., and $(n+1)V_{DD}$ appear at the nodes N11 of the capacitors C11 of the first (51-1), the second (51-2), ..., and the last (51-n) charging circuits, respectively, because of successive capacitance-coupling.

At the next high-level clock signal /φ, the potential converter 5 is reset through the resetting NMOS transistor QN14.

As disclosed, a boosted potential is obtained in synchronism with the low-level clock signal /φ (the high-level signal clock signal φ. This high potential turns on the NMOS transistor QN11 (FIG. 4), so that the output potential of the high voltage generator 1 is transferred to the capacitor C1 with almost no potential drop.

A charge pump provides potential increase by $V_{DD}$ only per clock. On the contrary, the potential converter 5 shown in FIG. 7 can produce a boosted potential higher than $V_{DD}$ per clock.

Moreover, the PMOS transistors QP11 and QP12 do not suffer high voltage application at their source-drain junctions, thus can be integrated in a small area. Each capacitor C11 also does not suffer high voltage application, thus can be formed with a thin dielectric film for large capacitance per unit of area. Therefore, the potential converter 5 in FIG. 7 having those transistors and capacitors can be formed in a small area.

Figure 8:
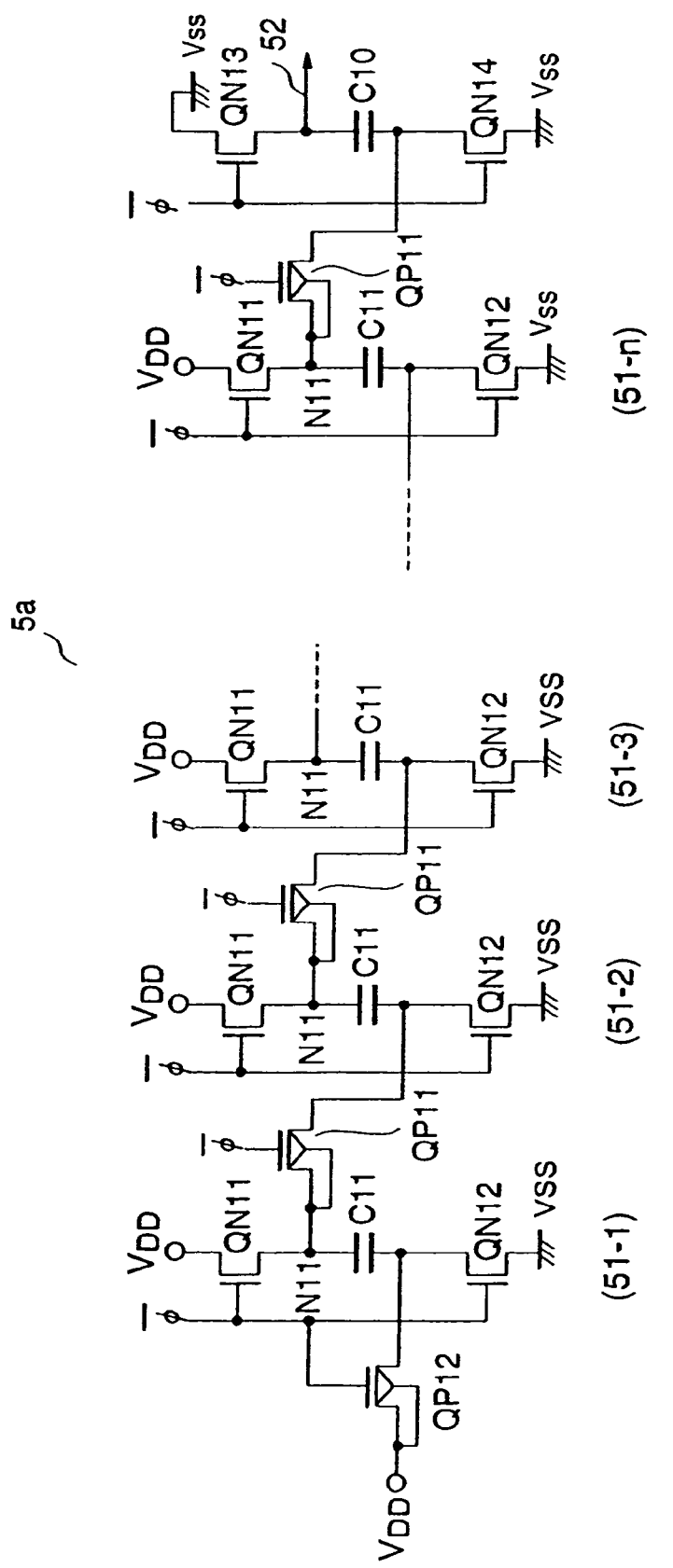
FIG. 8 shows a circuit diagram of a modification to the potential converter.

FIG. 8 shows a circuit diagram of a potential converter 5a, a modification to that shown in FIG. 7.

The potential converter 5a has a series of circuit of a capacitor C10 and NMOS transistors QN13 and QN14 at the output stage. The source of the NMOS transistor QN14 connected to a terminal of the capacitor C10 is connected to the low-level side power terminal $V_{SS}$. The drain of the NMOS transistor QN13 connected to the other terminal of the capacitor C10 is also connected to the low-level side power terminal $V_{SS}$. The gates of the NMOS transistors QN13 and QN14 are driven by the clock signal /φ, the same as the charging circuits 51.

At a high-level clock signal /φ, the capacitors C11 of the charging circuits 51 are charged whereas the capacitor C10 at the output stage is reset by the NMOS transistors QN13 and QN14 and discharged.

The NMOS transistors QN13 and QN14 are turned off when the clock signal /φ is turned into LOW to output a potential, via the capacitor C10, that has been boosted by series-coupling of the capacitors C11 of the charging circuits 51.

This potential converter 5a also has the same advantages when used for potential detection (FIG. 4) like the potential converter 5 shown in FIG. 7.

The potential converters 5 and 5a shown in FIGS. 7 and 8, respectively, output a high potential by charging a plurality of capacitors and switching of series capacitance-coupling.

Figure 9:
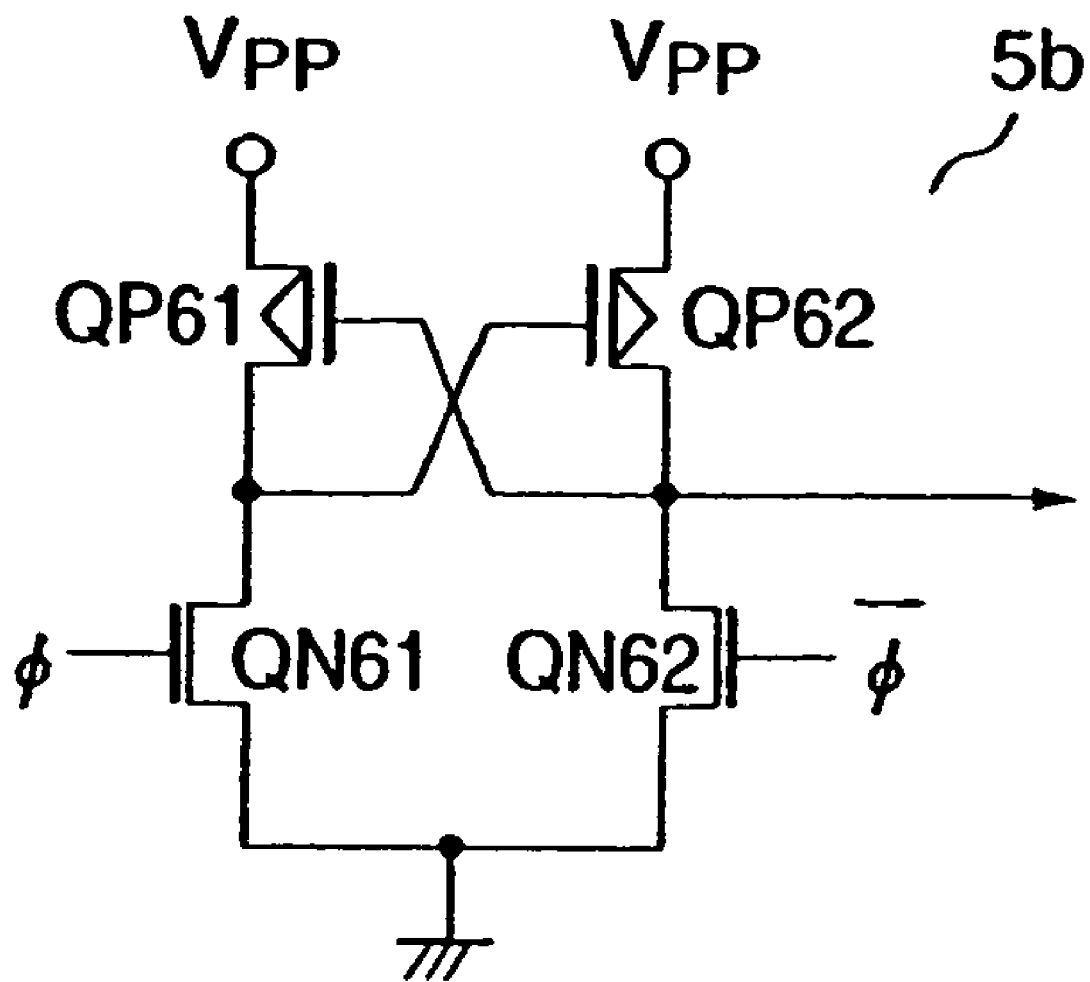
FIG. 9 shows a circuit diagram of another modification to the potential converter.

FIG. 9 shows a circuit diagram of a potential converter 5b that can be used for potential detection when there is a high voltage generator for generating a boosted potential Vpp.

The gates of differential NMOS transistors 61 and 62 whose sources are grounded together are driven by clock signals φ and /φ, respectively. The drain of these NMOS transistors QN61 and 62 are supplied with a boosted potential Vpp via PMOS transistors QP61 and QP62, respectively. The gates and drains of the PMOS transistors QP61 and QP62 are cross-connected to each other. The potential converter 5b outputs the boosted potential Vpp in synchronism with the clock signal φ having a potential the same as a power supply potential.

Figure 10:
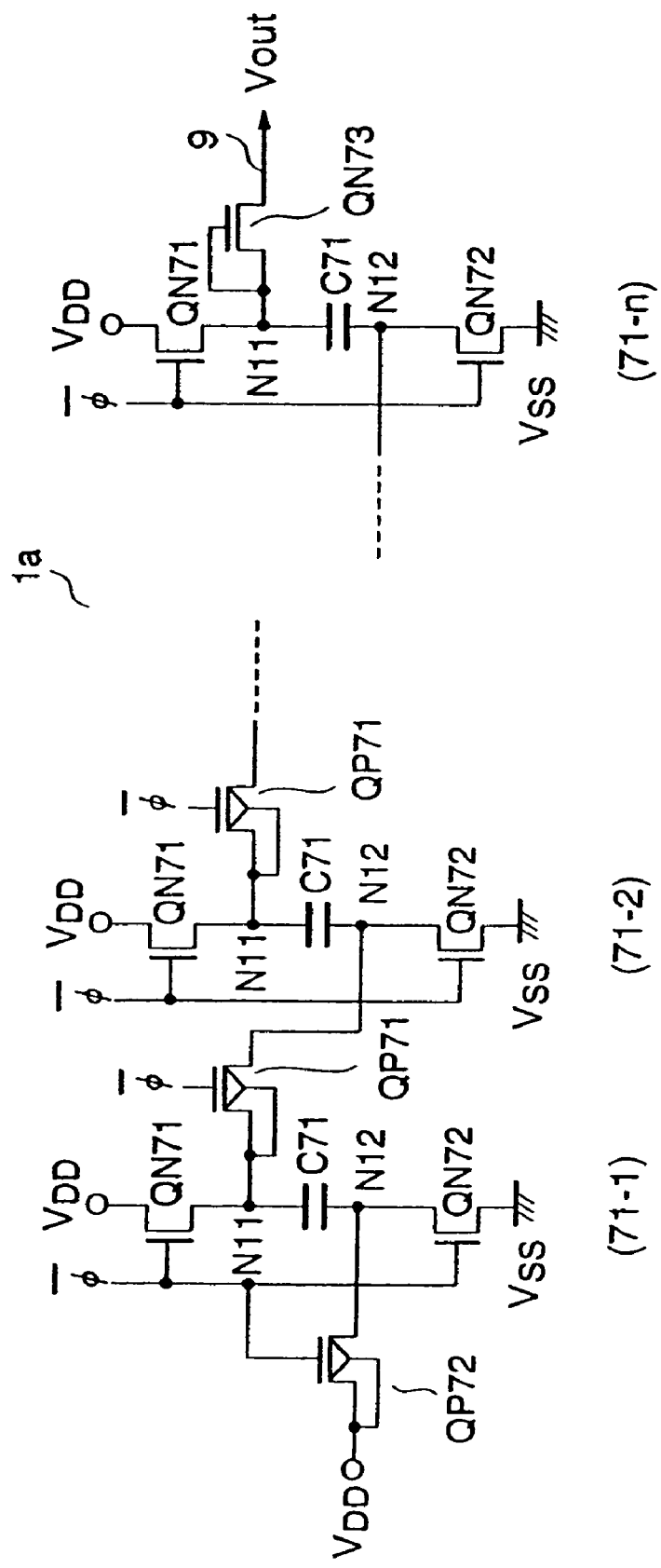
FIG. 10 shows a circuit diagram of a modification to the high voltage generator.

FIG. 10 shows a circuit diagram of a high voltage generator 1a that is a modification to the charge pump shown in FIG. 4, almost the same structure as those shown in FIGS. 7 and 8.

The high voltage generator 1a has a plurality of charging circuits 71 (71-1 to 71-n) and switching devices for connecting capacitors C71 of the circuits 71 in series.

Each charging circuit 71 has a capacitor C71, a terminal N11 thereof being connected to a high-level side power terminal $V_{DD}$ via a switching device NMOS transistor QN71 and the other terminal N12 being connected to a low-level side power terminal $V_{SS}$ via a switching device NMOS transistor QN72. The gates of NMOS transistors QN71 and QN72 are driven by a clock signal /ϕ.

PMOS transistors QP71 are switching devices for connecting the capacitors C71 of the charging circuits 71 in series. In detail, the PMOS transistor QP71 connects a high level-side node N11 of the capacitor C71, for example, of the first charging circuit 71-1 to a low level-side node N12 of the capacitor C71 of the second charging circuit 71-2. The gates of PMOS transistors QP71 are also driven by the clock signal /ϕ.

The low level-side node N12 of the capacitor C71 of the first charging circuit 71-1 is connected to the high-level side power terminal $V_{DD}$ via the PMOS transistor QP72 driven by the clock signal /ϕ.

The high level-side node N11 of the capacitor C71 of the last charging circuit 71-n is connected to the output terminal 9 (FIG. 4) via an NMOS transistor QN73 whose gate and source are connected like a diode.

The high voltage generator 1a operates the same as the potential converters 5 and 5a shown in FIGS. 7 and 8, respectively, thus generating a boosted high potential per clock cycle, different from a charge pump.

Figure 11:
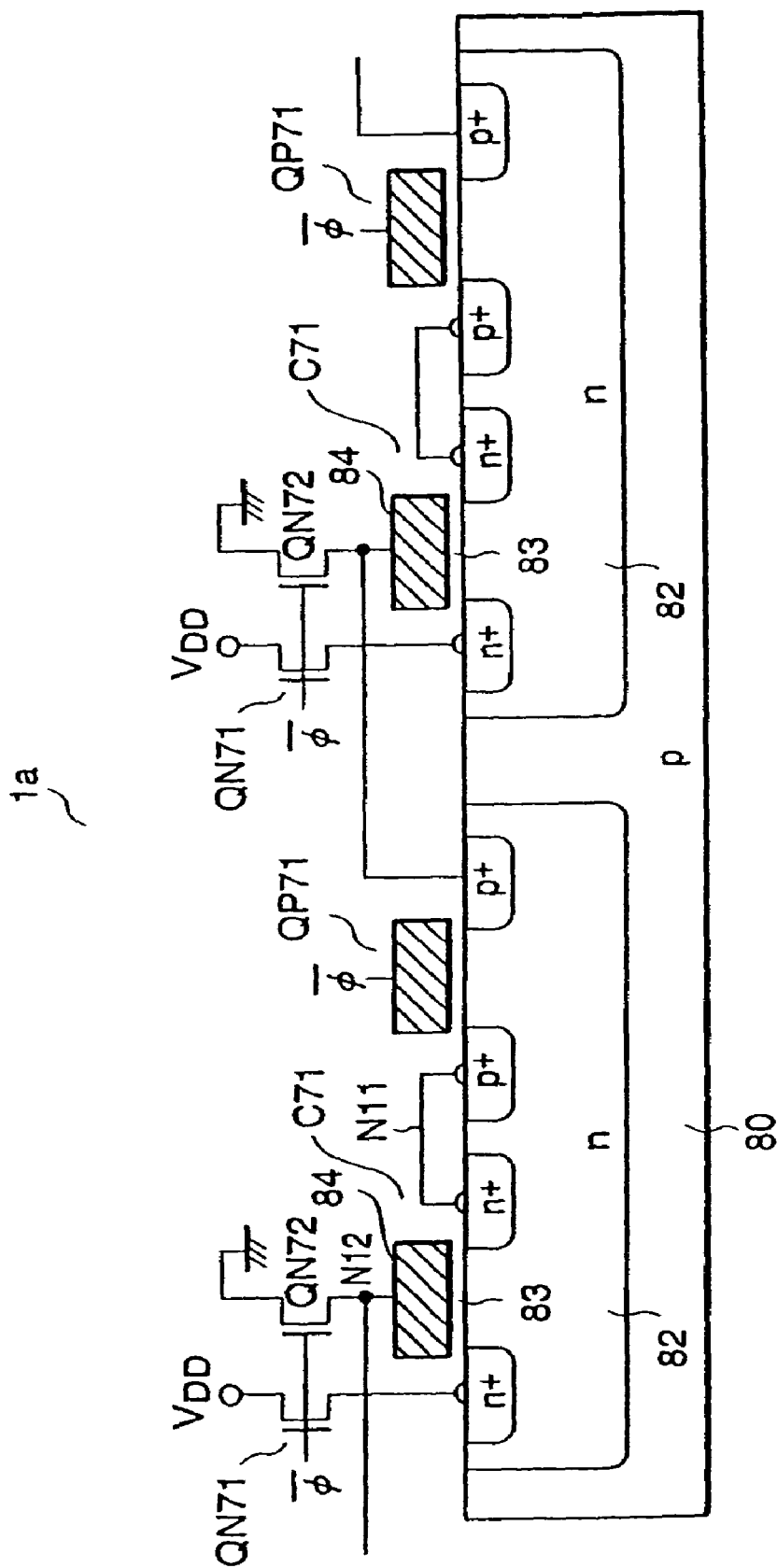
FIG. 11 illustrates a structure of the modification to the high voltage generator.

FIG. 11 illustrates a structure of adjacent two high voltage generators 1a shown in FIG. 10. The same structure is applied to the potential converters 5 and 5a shown in FIGS. 7 and 8, respectively.

The capacitors C71 of adjacent two charging circuits 71 are formed on n-type wells 82 isolated from each other in a p-type well of a silicon substrate 80. In detail, each capacitor C71 is a MOS-type capacitor having the n-type well 82 as a terminal and a gate electrode 84 formed on the n-type well 82 via a gate insulating film 83. The PMOS transistor QP71 is also formed in the n-type well 82 for coupling the capacitors C71 of adjacent two charging circuits.

It is apparent from the foregoing disclosure on operation, capacitance-coupling while the PMOS transistors QP71 is on ideally provides potentials on the n-type wells 82 as one of the terminals of the capacitors C71, accumulated by $V_{DD}$ per well. In reality, however, the junction-capacitance between the n-type well 82 and the p-type well 80 is much larger than the capacitor C71 to restrict a coupling ratio. The number of charging circuits have to be decided in consideration of such restricted coupling ratio for obtaining a required boosted potential.

The PMOS transistors QP71 are switching devices for coupling the capacitors C71 of adjacent charging circuits. The source and drain of each PMOS transistor QP71 do not suffer voltage application higher than $V_{DD}$. The PMOS transistors QP71 thus can be arranged on a small area. The capacitors C71 also do not suffer voltage application higher than $V_{DD}$. Thus, an NMOS transistor-type capacitor C71 having an insulating film 83 thinner than the gate oxide film of the PMOS transistor QP71 will exhibit large capacitance on a small area. Therefore, the high voltage generator 1a including these transistors and capacitors can be integrated on a small area.

Figure 12:
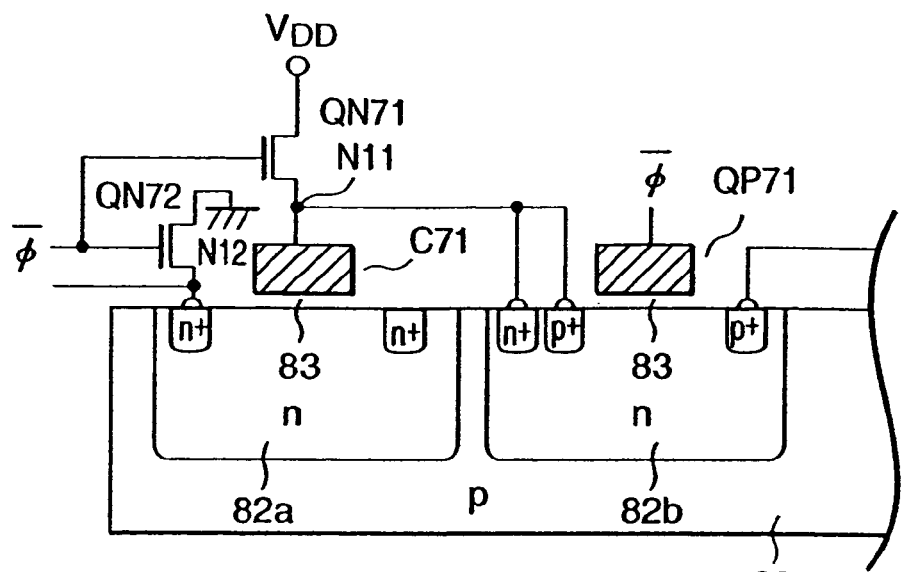
FIG. 12 illustrates another structure of the modification to the high voltage generator.

FIG. 12 illustrates a modification to the structure of the high voltage generator 1a shown in FIG. 10 for one charging circuit 71. The same structure can be applied to the potential converters 5 and 5a shown in FIGS. 7 and 8, respectively.

A difference between the structures in FIGS. 11 and 12 is that, in the latter, the PMOS transistor QP71 for coupling the capacitors C71 of adjacent charging circuits is formed in an n-type well 82b isolated from an n-type well 82a by the p-type well 80 of the silicon substrate. Another difference is that the NMOS transistor QN71 is connected to the gate electrode of the capacitor C71 while the NMOS transistor QN72 is connected to the n-type well 82a, as opposite of FIG. 11.

This structure serves to restrict parasitic capacitance to the high-level side node N11 of the capacitor C71 less than to the low-level side node N12 thereof with respect to the low-level side power terminal $V_{SS}$.

Also in the structure shown in FIG. 12, the PMOS transistors QP71 are switching devices for coupling the capacitors C71 of adjacent charging circuits. The source and drain of each PMOS transistor QP71 do not suffer voltage application higher than $V_{DD}$. The PMOS transistors QP71 thus can be arranged on a small area. The capacitors C71 also do not suffer voltage application higher than $V_{DD}$. Thus, an NMOS transistor-type capacitor C71 having an insulating film 83 thinner than the gate oxide film of the PMOS transistor QP71 will exhibit large capacitance on a small area. Therefore, the high voltage generator 1 in FIG. 12 having these transistor and capacitors can be integrated on a small area.

Figure 13:
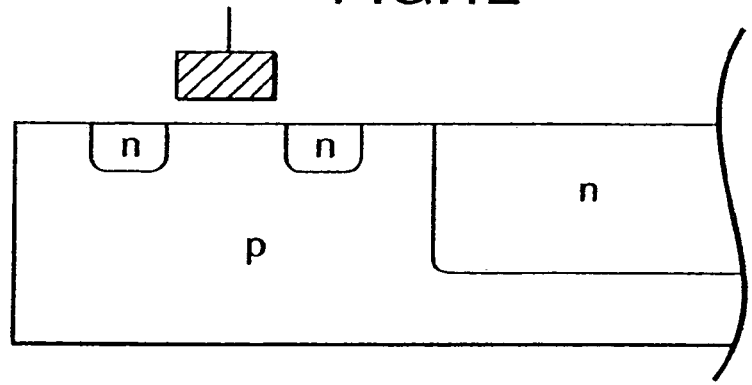
FIG. 13 illustrates another structure of the capacitor in the modification to the high voltage generator.

As illustrated in FIG. 13, each capacitor C71 can be an NMOS FET formed in a p-type semiconductor region or an NMOS transistor having a negative threshold level.

The foregoing disclosure is applied to the potential converters 5 and 5a in FIGS. 7 and 8, respectively. In detail, the structure illustrated in FIG. 11, 12 or 13 is applied to the capacitors C11 and the PMOS transistors QP11 in FIGS. 7 and 8 with a gate insulating film of each capacitor C11 thinner than that of each PMOS transistor QP11 of small area, thus achieving overall integration in a small area.

Figure 14:
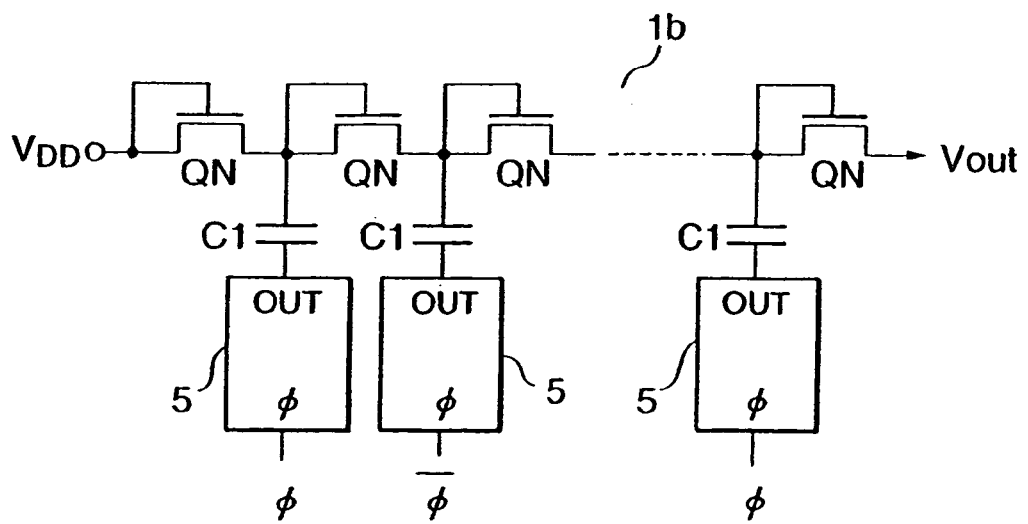
FIG. 14 shows a circuit diagram of another modification to the high voltage generator.

FIG. 14 shows a modification to the high voltage generator 1 in FIG. 4.

A high voltage generator 1b shown in FIG. 14 has a plurality of capacitors C1 driven by opposite-phase clocks ϕ and /ϕ and NMOS transistors QN that function as a diode to transfer charges stored in a capacitor C1 to the next one.

The first capacitor C1 is supplied with $V_{DD}$ via the MOS transistor QN. Connected to a clock-supplying terminal of each capacitor C1 of the charge pump is the potential converter 5 shown in FIG. 7.

Figure 15A:
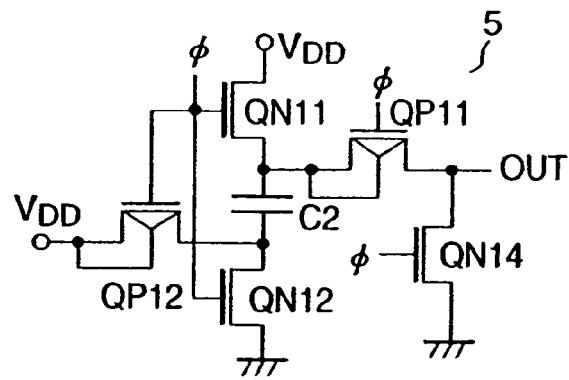
FIG. 15A shows a circuit diagram of still another modification to the potential converter.
Figure 15B:
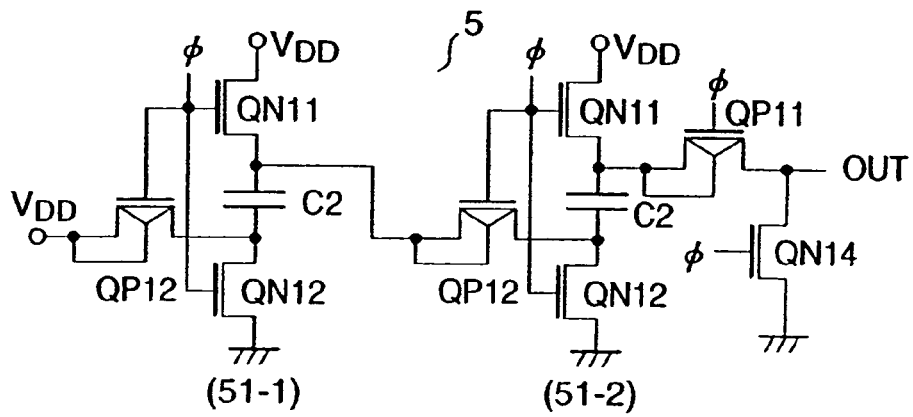
FIG. 15B shows a circuit diagram of a further modification to the potential converter.

In detail, as shown in FIG. 15A, a potential converter may be formed as one unit of circuit that consists of a capacitor C2, NMOS transistors QN11 and QN12, and PMOS transistors QP11 and QP12, or, as shown in FIG. 15B, it may be formed as series connection of a plurality of (two in FIG. 15B) of unit of circuit.

A dielectric film of the capacitor C2 for the potential converter is preferably thinner than that of the capacitor C1 for the charge pump because the dielectric film of the capacitor C2 will not suffer voltage application higher than a power supply voltage.

The capacitor C2 of the potential converter 5 is charged while the NMOS transistors QN11 and QN12 are on. A drive potential $V_{DD}$ is supplied to a low-level side terminal of the capacitor C2 whose other terminal is connected to an output terminal OUT when the NMOS transistors QN11 and QN12 are turned off whereas the PMOS transistors QP11 and QP12 are turned on. The output terminal OUT is reset by an NMOS transistor QN14 while the NMOS transistors QN11 and QN12 are on.

In FIG. 15B, the output PMOS transistor QP11 and the driving PMOS transistor QP12 are shared by adjacent two potential converters. In detail, the driving PMOS transistor QP12 of the potential converter 51-2 is used as an output transistor of the anterior potential converter 51-1 and the output PMOS transistor QP11 of the potential converter 51-2 is used as a driving transistor of the posterior potential converter 51-3 (not shown). The resetting NMOS transistor QN14 is provided only at the output terminal OUT of the last potential converter for several potential converters connected in series.

In the foregoing structure, the capacitor C2 of an even number stage of the potential converter 5 is coupled in series to the pumping capacitor C1 of the charge pump so that a clock potential boosted by the converter 5 is supplied to the capacitor C1 while the capacitor C1 of an odd number stage of the potential converter 5 is grounded.

On the other hand, the capacitor C2 of an odd number stage of the potential converter 5 is coupled in series to the pumping capacitor C1 of the charge pump so that a clock potential boosted by the converter 5 is supplied to the capacitor C1 while the capacitor C1 of an even number stage of the potential converter 5 is grounded. These two operations are repeated alternately.

According to these modifications, boosted clocks serve to decrease the number of charge pumps for obtaining the output level the same as that in the high voltage generator shown in FIG. 5.

In detail, the potential converter having the capacitance of the capacitor C2 the same as that of the capacitor C1 serves to decrease the number of charge pumps by ½ and ⅓ in FIGS. 15A and 15B, respectively.

The decrease in number of charge pumps allows a small area for the high voltage generator because a thin dielectric film can be used for the capacitor C2 of the potential converter 5 even though the total capacitance of the capacitors used in the high voltage generator is the same between the circuits shown in FIG. 5 and FIGS. 15A and 15B.

In FIGS. 15A and 15B, the NMOS transistors QN11, QN12 and QN14, and the PMOS transistors QP11 and QP12 are turned on in opposite phase. The timing for the NMOS transistors QN11, QN12 and QN14 to be turned off (or on) and that for the PMOS transistors QP11 and QP12 to be turned on (or off) may not meet each other completely. For example, the timing may be delayed a little bit so that the NMOS transistors QN11, QN12 and QN14 and the PMOS transistors QP11 and QP12 are not be turned on simultaneously, for prevention of punch-through current.

The high voltage generator 1 shown in FIG. 14 has charge pumps driven by two-phase clocks. However, it may have charge pumps driven by four-phase clocks shown in FIG. 16.

Figure 16:
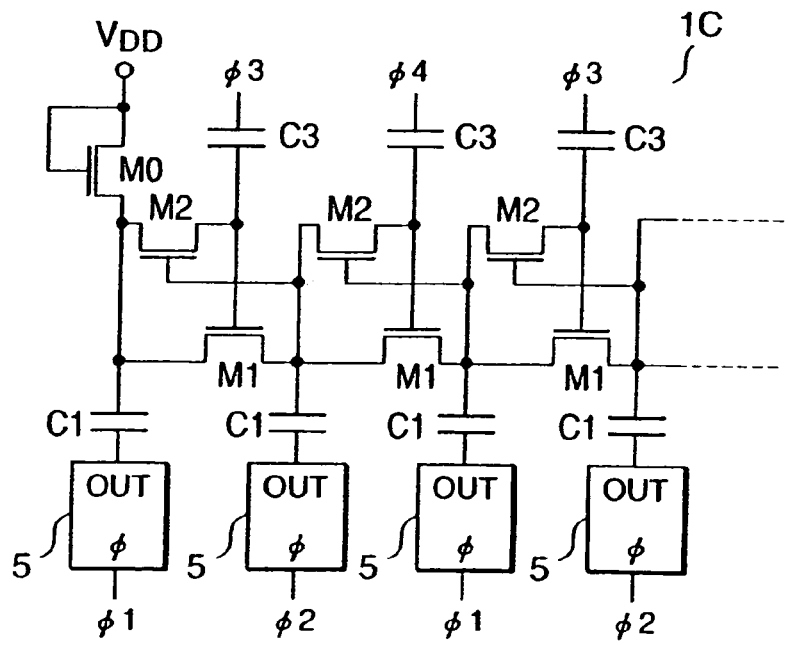
FIG. 16 shows a circuit diagram of still another modification to the high voltage generator.

A high voltage generator 1c shown in FIG. 16 has NMOS transistors M1, the gate thereof being driven by clocks φ3 and φ4 instead of the transfer devices NMOS transistors QN shown in FIG. 14. The gate of each NMOS transistor M1 is not connected to its drain but to a capacitor C3 via which the clock φ3 or φ4 is applied. Each capacitor C3 is provided with a charging NMOS transistor M2, the drain thereof being connected to the capacitor C1, the gate thereof being connected to the succeeding capacitor C1.

Figure 17:
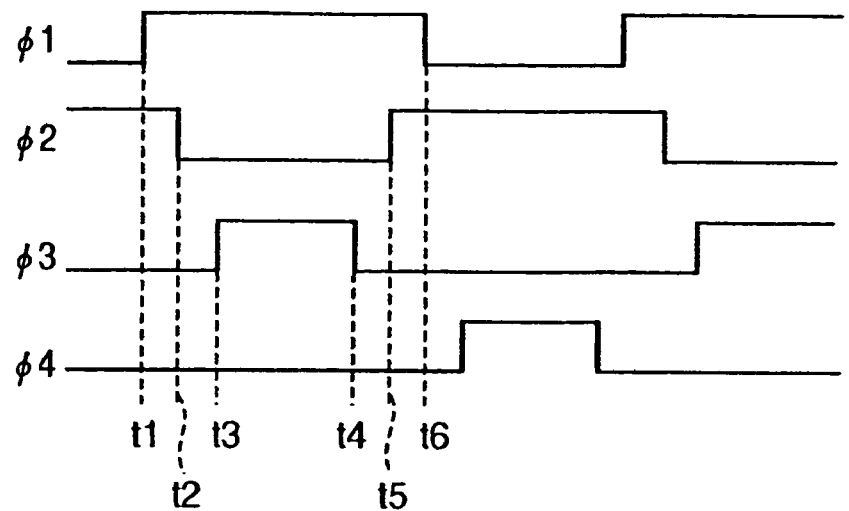
FIG. 17 illustrates waveforms of clock signals in the high voltage generator shown in FIG. 16.

An operation of the charge pumps shown in FIG. 16 is disclosed with reference to the timing chart illustrated in FIG. 17.

The capacitors C3 are charged via the NMOS transistors M2 during a period from moments t1 to t2 in which both clocks φ1 and φ2 are HIGH. Each odd number stage of the NMOS transistor M2 is turned off when the clock φ2 is turned into LOW at the moment t2. When the clock φ3 is turned into HIGH at a moment t3, a high voltage is supplied to the gate of each odd number stage of the NMOS transistor M1 via the capacitor C3, so that charges stored in each odd number stage of the capacitor C1 are transferred to the succeeding even number stage of the capacitor C1. When the clock φ3 is turned into LOW at a moment t4, each odd number stage of the NMOS transistor M1 is turned off. Likewise, charges stored in each even number stage of the capacitor C1 is transferred to the succeeding odd number stage of the capacitor C1 while the clock φ4 is HIGH during next cycle of the clocks φ1 and φ2.

The four-phase control provides a voltage applied to the gate of each NMOS transistor M1 higher than that applied to the drain thereof, resulting no effects of substrate bias effect, thus achieving charge transfer efficiency higher than the two-phase control shown in FIG. 14.

The delay for the clock φ3 that is turned into HIGH at the moment t3 after the clock φ2 has been turned into LOW from the moment t2 is required for protecting the NMOS transistors M2 from a reverse current.

Moreover, the delay for the clock φ2 that is turned into HIGH at a moment t5 after the clock φ3 has been turned into LOW from the moment t4 is required for protecting the NMOS transistors M1 from a reverse current.

Like the embodiment shown in FIG. 14, the four-phase driven charge pumps are provided with the potential converter 5 shown in 15A or 15B for supplying a boosted potential to each capacitor C1, thus achieving decrease in the number of charge pumps.

Figure 18:
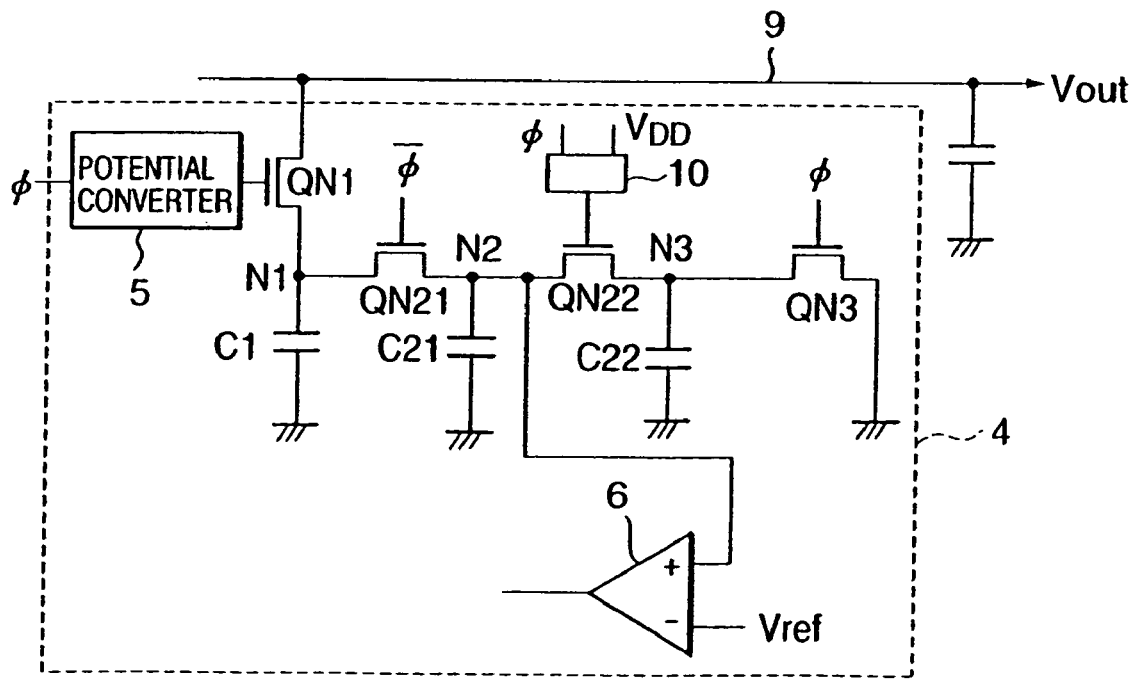
FIG. 18 shows a circuit diagram of another embodiment of a potential detector.

FIG. 18 shows a circuit diagram of another embodiment of the potential detector shown in FIG. 4.

The potential detector in FIG. 4 is provided with one capacitor C2 to which a certain amount of charges stored in the capacitor C1 are supplied.

On the contrary, this embodiment is provided with a plurality of capacitors C2 for varying capacitance, or a ratio of charge distribution to the capacitors C1 and C2, to vary an output boosted potential.

In detail, the embodiment in FIG. 18 is provided with two capacitors C21 and C22 as the capacitors C2. Also provided are an NMOS transistor QN21 connected between the node N1 of the capacitor C1 and the node N2 of the capacitor C21 and an NMOS transistor QN22 connected between the node N2 of the capacitor C21 and the node N3 of the capacitor C22.

A ratio of charge distribution can be varied by driving the gate of the NMOS transistor QN22 as follows:

When the gate of the NMOS transistor QN22 is driven by a clock φ via s switch 10 connected to this gate, the capacitor C22 is almost always discharged, so that it can be disregarded in operation. The NMOS transistor QN22 functions as a resetting device for the capacitor C21 together with the NMOS QN3.

The output potential Vout of the high voltage generator 1 in this operation is expressed, like the expression (1), as follows:

$$V_{ref} \cdot (C1+C21)/C1 \qquad (2)$$

Next, when the NMOS transistor QN22 is turned on by supplying $V_{DD}$ to the gate thereof via the switch 10, the two capacitors C21 and C22 are supplied with a certain amount of charges stored in the capacitor C1.

The output potential Vout of the high voltage generator 1 in this operation is expressed as follows:

$$Vref \cdot (C1+C21+C22)/C1 \quad (3)$$

As disclosed, the potential detector in this embodiment switches the amount of capacitance to selectively output different level of potentials Vout at the output terminal 9 of the high voltage generator 1.

The second capacitor may consist of capacitors of three or more for switching output potential among levels of three or more.

The potential detector according to the present invention generates a potential to be input to a comparator, which is lower than a potential at a terminal to be detected with a potential-charging operation to a capacitor and a charge-distribution operation between the capacitor and another capacitor.

Different from the known potential detector with potential division by resister, the potential detector according to the present invention generates no D. C. current. Moreover, the capacitor is formed with a large equivalent resistance but a small area, thus occupying a small area on the entire circuit area. The small area for the capacitor allows the potential detector to be almost free from leakage for stable potential detection with no delay in response which will occur when resisters of large resistance are used instead of capacitor.

Different from the known method of dividing an output potential of the high voltage generator by resistors, the high voltage generator according to the present invention requires the drive performance just for driving only the load with no decrease in response of the potential detector even at a large equivalent resistance, thus generating a constant boosted potential.

As disclosed, the present invention offers a potential detector capable of stable potential detection while consuming a low power. Moreover, the present invention offers a semiconductor circuit with the potential detector having an high voltage generator for generating a constant potential output.

What is claimed is:

1. A semiconductor integrated circuit having a high voltage generator for generating a boosted internal power supply potential, the high voltage generator comprising:
    a charge pump including a plurality of first capacitors, adjacent two first capacitors being driven by clocks with opposite timing and a transfer device for transferring charge stored in one first capacitor to the succeeding first capacitor; and
    a potential converter for supplying a boosted clock to at least one of the plurality of first capacitors, the potential converter including a second capacitor having a dielectric film thinner than a dielectric film of the first capacitor and having a high-level side terminal and a low-level side terminal;
    wherein the second capacitor is charged and coupled in series to the at least one of the plurality of first capacitors via the high-level side terminal while being supplied a given potential via the low-level side terminal when charge stored in the one first capacitor is transferred to the succeeding first capacitor.

2. The semiconductor integrated circuit according to claim 1, wherein the potential converter includes at least a first circuit and a second circuit connected in series, each of the first circuit and second circuit having respective second capacitors, wherein the second capacitor of the second circuit is charged and coupled in series to the one first capacitor via the high-level side terminal thereof while the second capacitor of the first circuit is supplied a given potential via the low-level side terminal thereof when charge stored in the one first capacitor is transferred to the succeeding first capacitor.

3. A semiconductor integrated circuit having a high voltage generator for generating a boosted internal power supply potential, the high voltage generator comprising:
    a plurality of first capacitors;
    a plurality of second capacitors provided alternately with the first capacitors;
    a first potential converter for supplying a first boosted clock to the first capacitor, the first potential converter including a third capacitor having a dielectric film thinner than a dielectric film of the first capacitor, and;
    a second potential converter for supplying a second boosted clock to the second capacitor, the second potential converter including a fourth capacitor having a dielectric film thinner than a dielectric film of the second capacitor,
    wherein the second capacitors are charged during a first period associated with the first boosted clock whereas the first capacitors are charged during a second period associated with the second boosted clock.

4. The semiconductor integrated circuit according to claim 3 further comprising:
    a first transfer device for transferring charge stored in the first capacitor to the succeeding second capacitor during a third period that is delayed from the first period by a predetermined time; and
    a second transfer device for transferring charge stored in the second capacitor to the succeeding first capacitor during a fourth period that is delayed from the second period by a predetermined time.

5. The semiconductor integrated circuit according to claim 3, wherein the third capacitor is charged during a period in which the first boosted clock to be supplied to the first capacitor is at a first level, a first terminal of the third capacitor being electrically coupled to the first capacitor and a second terminal of the third capacitor being supplied a voltage higher than zero volts during a period in which the first boosted clock to be supplied to the first capacitor is at a second level higher than the first level.

6. The semiconductor integrated circuit according to claim 3, wherein the fourth capacitor is charged during a period in which the second boosted clock to be supplied to the second capacitor is at a first level, a first terminal of the fourth capacitor being electrically coupled to the second capacitor and a second terminal of the fourth capacitor being supplied a voltage higher than zero volts during a period in which the second boosted clock to be supplied to the second capacitor is at a second level higher than the first level.

7. The semiconductor integrated circuit according to claim 4, wherein the third period terminates at a predetermined time before the succeeding second period starts.

8. The semiconductor integrated circuit according to claim 4, wherein the fourth period terminates at a predetermined time before the succeeding first period starts.

9. The semiconductor integrated circuit according to claim 4, wherein the first transfer device includes a first NMOS transistor, a source thereof being connected to the first capacitor, a drain thereof being connected to the succeeding second capacitor, the high voltage generator further including:

a fifth capacitor connected to a gate of the first NMOS transistor; and a second NMOS transistor, a source thereof being connected to the source of the first NMOS transistor, a drain thereof being connected to the gate of the first NMOS transistor and a gate thereof being connected to the drain of the first NMOS transistor, wherein the second NMOS transistor is turned on during a period in which levels of the first and the second boosted clocks overlap one another to charge the fifth capacitor, and charge stored in the fifth capacitor are supplied to the gate of the first NMOS transistor during the third period, charge stored in the first capacitor being transferred to the succeeding second capacitor via the first transfer device thus turned on.

10. The semiconductor integrated circuit according to claim 4, wherein the second transfer device includes a first NMOS transistor, a source thereof being connected to the second capacitor, a drain thereof being connected to the succeeding first capacitor, the high voltage generator further including:

a fifth capacitor connected to the gate of the first NMOS transistor; and a second NMOS transistor, a source thereof being connected to the source of the first NMOS transistor), a drain thereof being connected to the gate of the first NMOS transistor and a gate thereof being connected to the drain of the first NMOS transistor, wherein the second NMOS transistor is turned on during a period in which levels of the first and the second boosted clocks overlap the other to charge the fifth capacitor, and charge stored in the fifth capacitor is supplied to the gate of the first NMOS transistor during the fourth period, charge stored in the second capacitor being transferred to the succeeding first capacitor via the second transfer device thus turned on.

11. The semiconductor integrated circuit according to claim 3, wherein a first terminal of the third capacitor is connected to a high-level side power terminal via a first switching device, and a second terminal of the third capacitor is connected to a low-level side power terminal via a second switching device that is turned on when the first switching device is turned on, the first potential converter further including:

a third switching device that is turned on in opposite timing for the first and the second switching devices to supply a driving potential to the second terminal of the third capacitor;

a fourth switching device that is turned on when the third switching device is turned on, to connect the first terminal of the third capacitor to an output terminal; and a fifth switching device that is turned on when the first switching device is turned on, to reset a potential at the output terminal, wherein the third capacitor is charged while the first and the second switching devices are on and the charged third capacitor is coupled to the first capacitor in series while the third and the fourth switching devices are on.

12. The semiconductor integrated circuit according to claim 3, wherein a first terminal of the fourth capacitor is connected to a high-level side power terminal via a first switching device, and a second terminal of the fourth capacitor is connected to a low-level side power terminal via a second switching device that is turned on when the first switching device is turned on, the second potential converter further including:

a third switching device that is turned on in opposite timing for the first and the second switching devices to supply a driving potential to the second terminal of the fourth capacitor;

a fourth switching device that is turned on when the third switching device is turned on, to connect the first terminal of the fourth capacitor to an output terminal; and a fifth switching device that is turned on when the first switching device is turned on, to reset a potential at the output terminal, wherein the fourth capacitor is charged while the first and the second switching devices are on and the charged fourth capacitor is coupled to the second capacitor in series while the third and the fourth switching devices are on.

* * * * *